United States Patent [19]

Flohr et al.

[11] Patent Number: 5,712,568

[45] Date of Patent: Jan. 27, 1998

[54] BATTERY VOLTAGE MEASUREMENT SYSTEM

[75] Inventors: Gary Robert Flohr, Northville; Paul William Keberly, Sterling Heights, both of Mich.

[73] Assignee: Ford Motor Company, Dearborn, Mich.

[21] Appl. No.: 523,320

[22] Filed: Sep. 5, 1995

[51] Int. Cl.⁶ ............................................. G01N 27/416
[52] U.S. Cl. .............................. 324/434; 320/48; 324/433
[58] Field of Search ................................. 324/434, 427, 324/435; 420/14, 48

[56] References Cited

U.S. PATENT DOCUMENTS

| | | | |
|---|---|---|---|
| 4,424,491 | 1/1984 | Bobbett et al. | 324/433 |
| 4,484,140 | 11/1984 | Dieu | 324/434 |
| 4,590,430 | 5/1986 | Vandenberghe et al. | 324/427 |
| 4,833,459 | 5/1989 | Geuer et al. | 340/636 |
| 4,871,956 | 10/1989 | Barrella | 320/13 |
| 4,931,738 | 6/1990 | MacIntyre et al. | 324/435 |
| 5,040,088 | 8/1991 | Harrington et al. | 361/31 |
| 5,099,211 | 3/1992 | Nowak | 324/434 |
| 5,170,124 | 12/1992 | Blair et al. | 324/434 |
| 5,206,578 | 4/1993 | Nor | 320/14 |
| 5,349,535 | 9/1994 | Gupta | 364/483 |
| 5,646,534 | 7/1997 | Kopera | 324/434 |

*Primary Examiner*—Ernest F. Karlsen
*Assistant Examiner*—Thomas Valone
*Attorney, Agent, or Firm*—Mark S. Sparschu

[57] ABSTRACT

In one embodiment of the present invention, a system is provided or measuring the voltages of the traction batteries of an electric vehicle. The system includes switches provided to switchably couple the batteries individually to an amplifier. The system also includes switches provided to assure that the same polarity is always provided to the amplifier; a single-ended amplifier can thus be used. The system includes an analog-to-digital converter coupled in communication with the output of the amplifier, and an optical coupler which couples the output of the analog-to-digital converter to the low-voltage portion of the electric vehicle's electrical system.

6 Claims, 2 Drawing Sheets

BATTERY VOLTAGE MEASUREMENT SYSTEM

BACKGROUND OF THE INVENTION

1. Field of the Invention

The present invention relates to electrical multiplex systems.

2. Description of the Related Art

In an electric vehicle, accurate monitoring of the individual voltages of the traction batteries (the batteries which provide energy for propulsion of the vehicle) is very important. Accurate monitoring facilitates effective charging of the batteries, as well as effective control over the discharging of the batteries as the vehicle operates. An important feature of a battery monitoring system is to maintain the voltage isolation typically provided in an electric vehicle between the traction batteries and the "low voltage" portion of the vehicle electrical system, which is typically referenced to chassis ground.

One known way to monitor the voltages of the traction batteries is with a voltage divider network coupled to the traction batteries. This network provides an individual voltage divider for each battery, with the individual voltage dividers typically multiplexed into a circuit for measuring the voltage outputs from the voltage dividers. However, a difficulty arises with such a system. Because the traction batteries are normally series-connected, the voltage of the batteries connected near the top of the series connection must be divided down through extremely high-ratio voltage dividers in order to be read by the same voltage-measuring circuit which measures the batteries near the bottom of the series connection. The use of such extremely high-ratio voltage dividers requires the resistors which comprise the voltage dividers to have extremely low tolerance to provide accurate voltage measurements.

One possible solution to this problem is disclosed in U.S. Pat. No. 4,484,140, issued to Dieu. In the '140 disclosure, the inputs of a differential amplifier are switched for connection across the individual batteries to be measured. Thus, the need for high-ratio voltage dividers is eliminated.

The system of the '140 disclosure, though perhaps generally effective, has at least two shortcomings. First, the amplifier in the '140 disclosure is a differential amplifier. The differential amplifier of the '140 disclosure requires split voltage supplies. Providing split voltage supplies, as opposed to providing a single voltage supply, is relatively expensive. Second, the amplifier of the '140 disclosure passes an analog signal across an optical isolation boundary within the amplifier. Passing an analog signal across an optical isolation boundary provides the opportunity for inaccuracies to be introduced into the signal. Where high accuracy is required, such as in monitoring the voltages of traction batteries of an electric vehicle, such inaccuracies are disadvantageous.

Thus, a system which eliminates the requirement for split supplies, and which reduces the inaccuracies introduced in passing an analog signal across an isolation boundary, will provide advantages over the prior art.

SUMMARY OF THE INVENTION

The present invention provides a battery measurement system for an electrical system having a high-voltage portion and a low-voltage portion, the high-voltage portion comprising a plurality of series-connected batteries, each with two terminals, the high-voltage portion further isolated by design from the low-voltage portion. The battery measurement system comprises first and second electrical junctions. The battery measurement system also includes switching means coupled to each battery, the switching means comprising a first switch with a first side and a second side, the first side coupled in electrical communication with a terminal of the battery and the second side coupled in electrical communication with the, first junction; and a second switch with a first side and a second side, the first side coupled in electrical communication with the other terminal of the battery and the second side coupled in electrical communication with the second junction. The battery measurement system also includes an amplifier comprising an input terminal, an output terminal and another terminal. Further, the battery measurement system comprises a third switch coupling the amplifier input to the first junction, a fourth switch coupling the amplifier input to the second junction, a fifth switch coupling the other amplifier terminal to the first junction and a sixth switch coupling the other amplifier terminal to the second junction.

The present invention also provides a battery voltage measurement system for an electrical system having a high-voltage portion and a low-voltage portion, the high-voltage portion comprising a plurality of series-connected batteries, each with two terminals, the high-voltage portion further isolated by design from the low-voltage portion. The battery voltage measurement system comprises an amplifier switchably coupled for electrical connection individually across the batteries, the amplifier having an output. The battery voltage measurement system further includes an analog-to-digital converter coupled in electrical communication with the output of the amplifier, the analog-to-digital converter having an output. Also, the battery voltage measurement system comprises voltage isolation means coupled in electrical communication with the output of the analog-to-digital converter, the voltage isolation means having an output in the low-voltage portion of the electrical system.

Systems provided in accordance with some embodiments of the present invention can eliminate the split supplies needed in the aforementioned prior art battery measurement system. Further, systems provided in accordance with some embodiments of the present invention can provide greater voltage measurement accuracy than a system which passes analog signals across an optical isolation boundary. The present invention can thus provide advantages over the prior art.

DETAILED DESCRIPTION OF THE PREFERRED EMBODIMENT

Figure 1:
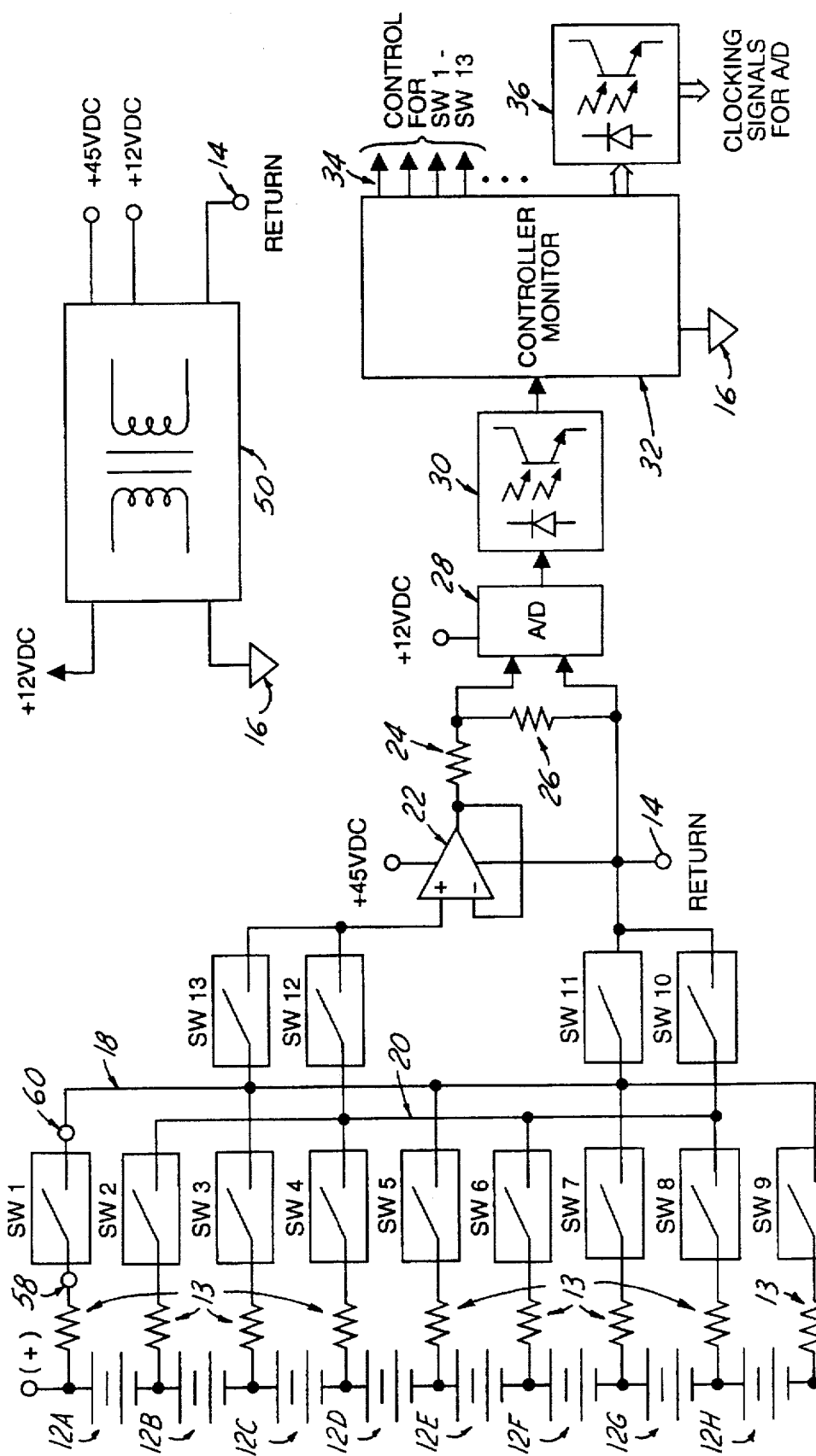
FIG. 1 is an electrical schematic of a system according to one embodiment of the present invention.

Referring to FIG. 1, a battery voltage measurement system according to one embodiment of the present invention will be described. The system includes a plurality of batteries 12A–12H. Batteries 12A–12H are, for example, traction batteries which provide energy for propulsion of an electric vehicle. The series connection of batteries 12A–12H provides a voltage between the (+) and (−) terminals for propulsion of the electric vehicle. Batteries 12A–12H can, for example, be 40-volt batteries.

As is typical in electric vehicle systems, batteries 12A–12H are electrically isolated by design from chassis ground 16 of the vehicle. The portion of the vehicle electrical system which is referenced to chassis ground 16 and isolated from batteries 12A–12H will hereinafter be called the "low voltage" portion of the electrical system. This portion of the vehicle electrical system is, in this embodiment of the present invention, at a nominal 12 volts. It contains the conventional electrical accessories of the vehicle. The portion of the electrical system not so isolated from batteries 12A–12H will be called the "high voltage" portion of the electrical system.

Coupled across batteries 12A–12H via current limiting resistors 13 is a network of switches SW1–SW9. Alternate switches (in this example SW1, SW3, SW5, SW7 and SW9) are coupled at a junction 18. The remaining switches (in this example SW2, SW4, SW6 and SW8) are coupled at a second junction 20.

Junction 18 is coupled to two switches SW11 and SW13. Junction 20 is coupled to two switches SW10 and SW12. The second sides of switches SW12 and SW13 are coupled together and fed to the non-inverting input of an operational amplifier 22. Those skilled in the art will recognize that in this embodiment of the present invention, operational amplifier 22 is configured as a "unity-gain" amplifier. The second sides of switches SW10 and SW11 are coupled together and connected to "return" 14.

Return 14 is the low-side reference on the output of a DC-DC converter 50. DC-DC converter 50 converts 12 volts DC (12 VDC) from the low-voltage side of the vehicle's electrical system to 45 VDC and 12 VDC on the high-voltage side. A transformer within DC-DC converter 50 maintains isolation between the high-voltage and low-voltage sides of the vehicle electrical system. The 45 VDC and 12 VDC at the output of DC-DC converter 50 are referenced to return 14.

Return 14 is coupled to the reference terminal of amplifier 22. The reference terminal of amplifier 22 is also sometimes known as the "ground" terminal or the $V_{ee}$ terminal.

A voltage divider comprising resistors 24 and 26 divides the voltage at the output of amplifier 22 (if necessary) for reading by A/D converter 28. The output of A/D converter 28 is a serial digital representation of the analog signal at the input of A/D converter 28. (Note that an A/D converter with a parallel output can be used as well.) This digital information is transferred by optical coupler 30 to the "low voltage" portion of the electrical system. There, the digital information is read by controller/monitor 32.

Controller/monitor 32 preferably includes a microprocessor having sufficient microcomputer resources (inputs, outputs, memory, throughput and the like) to perform the functions ascribed to it herein. As just mentioned, one function of controller/monitor 32 is to read the digital signals coming from optical coupler 30, those signals representing the voltages of batteries 12A–12H. Another function of controller/monitor 32 is to control switches SW1–SW13 via circuits 34, as will be described in more detail below. Yet another function of controller/monitor 32 is to provide clocking signals for A/D converter 28 via optical coupler 36. These clocking signals are used by A/D converter 28 to provide timing for generating the digital output signals provided by A/D converter 28.

Figure 2:
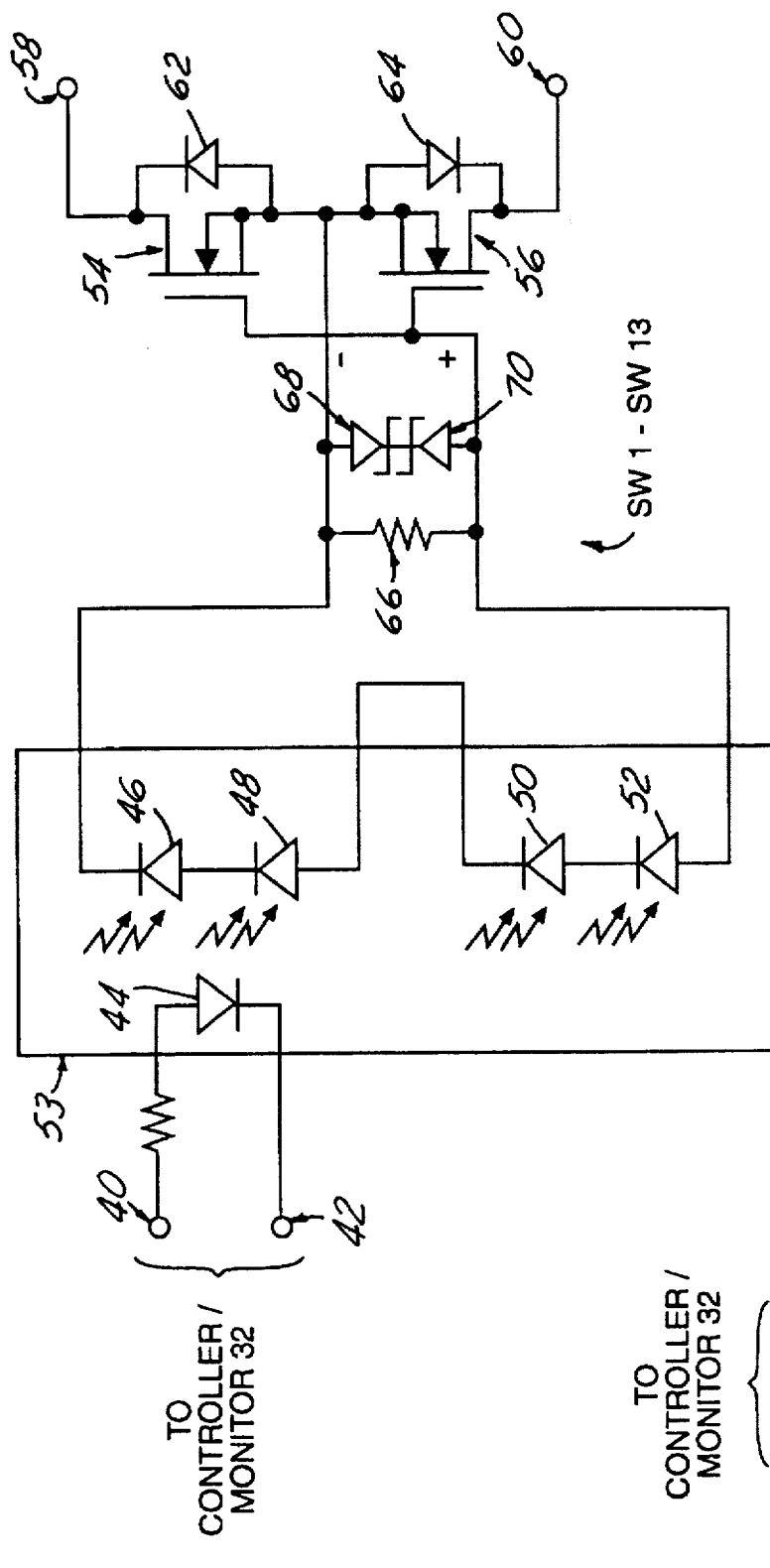
FIG. 2 is an electrical schematic of one possible configuration for switches SW1–SW13 of FIG. 1.

Referring additionally to FIG. 2, one possible configuration of switches SW1–SW13 is illustrated. Input terminals 40 and 42 are the terminals through which controller/monitor 32 controls the switch. To close the switch, controller/monitor 32 energizes light-emitting diode 44. Photovoltaic diodes 46, 48, 50 and 52, which along with light-emitting diode 44 are available in a single package 53 such as the DIG-12-08-010 from Dionics Corporation, then convert that light to a voltage with a polarity shown by the "+" and "−" labels in FIG. 2. n-channel field-effect transistors (FETS) 54 and 56 thus both have their gates at a positive voltage with respect to their sources. FETS 54 and 56 thus conduct, closing the connection between terminals 58 and 60 (that is, closing the switch). When the switch is so closed, current can flow in either direction between terminals 58 and 60. Two FETS 54 and 56 are provided, as opposed to only one, to prevent any unintended leakage current through anti-parallel diodes 62 and 64 when the switch is intended to be off. Anti-parallel diodes 62 and 64 are features inherent in the construction of channel-type FETS.

Resistor 66 bleeds off charge from the gates of FETS 54 and 56 when the switch is to be turned off, assuring fast switching. Zener diodes 68 and 70 clamp the gate-to-source and source-to-gate voltage as necessary.

Figure 3:
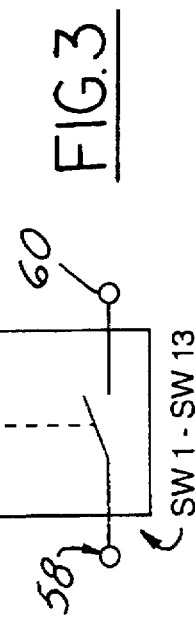
FIG. 3 is an electrical schematic of a second possible configuration for switches SW1–SW13.

A second configuration of switches SW1–SW13 is shown in FIG. 3. This second configuration is a conventional electromechanical relay controlled by controller/monitor 32. Such a relay has inherent voltage isolation between the coil and the contact. Therefore, no optical coupling is necessary, as it is in the configuration of FIG. 2. However, the configuration of FIG. 2 has advantages of its own (reliability and switching speed, to name two such advantages).

The operation of this system in measuring the voltages of batteries 12A–12H is as follows. For the purposes of this discussion, assume that each battery 12A–12H has a nominal voltage of 40 volts and that there are eight batteries 12A–12H (although neither of these assumptions is fundamental to the present invention);

To measure the voltage of the uppermost battery 12A, SW1, SW2, SW10 and SW13 are closed at the command of controller/monitor 32. The upper terminal of the upper battery 12A is thus connected to the non-inverting terminal of amplifier 22 (via a resistor 13). The lower terminal of the uppermost battery 12A is connected to return 14 (via a resistor 13). The output of amplifier 22 is thus the voltage across battery 12A. This voltage is scaled (if necessary) by the voltage divider comprising resistors 24 and 26, converted to digital signals by A/D converter 28 and provided across optical coupler 30 to controller/monitor 32.

To measure the voltage of battery 12B, SW2, SW3, SW11 and SW12 are closed at the command of controller/monitor 32. The upper terminal of battery 12B is thus connected to the non-inverting terminal of amplifier 22, while the lower terminal of battery 12B is connected to return 14. The output of amplifier 22 is thus the voltage across battery 12B. This voltage is provided to controller/monitor 32, as was the voltage across battery 12A.

One will recognize that through the proper closing of switches SW1–SW13, the voltage across each battery 12A–12H can be measured and this measurement can be done with amplifier 22 connected to a single power supply (rather than split supplies). A single supply can be used because switches SW10–SW13 assure that the proper polarity is provided to the non-inverting input of amplifier 22. The switches which are closed to measure the voltages of batteries 12A–12H are as follows:

| Battery voltage measured | Switches closed |
|---|---|
| 12A | SW1, SW2, SW10, SW13 |
| 12B | SW2, SW3, SW11, SW12 |
| 12C | SW3, SW4, SW10, SW13 |
| 12D | SW4, SW5, SW11, SW12 |
| 12E | SW5, SW6, SW10, SW13 |
| 12F | SW6, SW7, SW11, SW12 |
| 12G | SW7, SW8, SW10, SW13 |
| 12H | SW8, SW9, SW11, SW12 |

In addition to amplifier 22 running from a single supply, one skilled in the art will recognize a another distinct advantage provided by the present system. With analog-to-digital converter 28 being located on the "high voltage" side of the system, the signals being passed by optical isolator 30 are digital. Thus, inaccuracies which would accrue in passing analog signals across an optical isolation barrier are eliminated.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. In an electrical system having a high-voltage portion and a low-voltage portion, said high-voltage portion comprising a plurality of series-connected batteries, each with two terminals, said high-voltage portion further isolated by design from said low-voltage portion, a battery voltage measurement system comprising:

first and second electrical junctions;

switching means in electrical communication with each battery, said switching means comprising a first switch with a first side and a second side, said first side coupled in electrical communication with a terminal of said battery and said second side coupled in electrical communication with said first junction; and a second switch with a first side and a second side, said first side coupled in electrical communication with the other terminal of said battery and said second side coupled in electrical communication with said second junction;

an amplifier comprising an input terminal, an output terminal and another terminal;

a third switch coupling said amplifier input to said first junction;

a fourth switch coupling said amplifier input to said second junction;

a fifth switch coupling said another terminal to said first junction; and a sixth switch coupling said another terminal to said second junction;

an analog-to-digital converter located in said high-voltage portion of said system and coupled to receive a signal from the output of said amplifier; and voltage isolation means coupled between said analog-to-digital converter and said low-voltage portion of said electrical system.

2. A battery voltage measurement system as recited in claim 1, wherein said another terminal is a reference terminal of said amplifier.

3. A battery voltage measurement system as recited in claim 2, wherein said switching means comprises a series connection of field-effect transistors.

4. A battery voltage measurement system as recited in claim 3, wherein said voltage isolation means comprises an optical isolator.

5. A battery voltage measurement system as recited in claim 2, wherein said switching means comprises an electromechanical relay.

6. A battery voltage measurement system as recited in claim 5, wherein said voltage isolation means comprises an optical isolator.

* * * * *